United States Patent [19]

Schweitzer, Jr.

[11] Patent Number: 5,677,678
[45] Date of Patent: Oct. 14, 1997

[54] FAULT INDICATOR HAVING AUXILIARY FAULT SENSING WINDING

[76] Inventor: Edmund O. Schweitzer, Jr., 2433 Center St., Northbrook, Ill. 60062

[21] Appl. No.: 628,087

[22] Filed: Apr. 8, 1996

[51] Int. Cl.$^6$ .................................................. G08B 21/00
[52] U.S. Cl. .......................... 340/664; 340/650; 324/96; 324/133
[58] Field of Search ........................ 340/664, 650; 324/96, 133, 508

[56] References Cited

U.S. PATENT DOCUMENTS

| | | | |
|---|---|---|---|
| 4,234,847 | 11/1980 | Schweitzer | 340/654 |
| 4,251,770 | 2/1981 | Schweitzer, Jr. | 340/654 |
| 4,424,512 | 1/1984 | Schweitzer, Jr. | 340/664 |
| 4,495,489 | 1/1985 | Schweitzer, Jr. | 340/664 |
| 4,686,518 | 8/1987 | Schweitzer, Jr. | 340/664 |
| 4,794,331 | 12/1988 | Schweitzer, Jr. | 324/133 |
| 4,794,332 | 12/1988 | Schweitzer, Jr. | 324/133 |
| 4,795,982 | 1/1989 | Schweitzer, Jr. | 324/508 |
| 4,904,932 | 2/1990 | Schweitzer, Jr. | 324/133 |
| 5,055,771 | 10/1991 | Gamble et al. | 324/133 |
| 5,070,301 | 12/1991 | Schweitzer, Jr. | 324/509 |
| 5,153,565 | 10/1992 | Schweitzer, Jr. | 340/650 |
| 5,220,311 | 6/1993 | Schweitzer, Jr. | 340/650 |
| 5,274,324 | 12/1993 | Schweitzer, Jr. | 324/96 |
| 5,420,502 | 5/1995 | Schweitzer, Jr. | 324/96 |

Primary Examiner—Thomas Mullen
Assistant Examiner—John Tweel, Jr.
Attorney, Agent, or Firm—Lockwood, Alex, FitzGibbon & Cummings

[57] ABSTRACT

A fault indicator is described which indicates the occurrence of a fault current in a monitored electrical conductor. The fault indicator includes a magnetic pole assembly which mounts the housing of the fault indicator to the monitored electrical conductor. The magnetic pole assembly includes both a main outer magnetic core assembly and an auxiliary inner magnetic core assembly. As described, an auxiliary fault sensing winding is disposed on the inner magnetic core assembly so that it becomes energized and provides power for fault circuitry within the fault indicator upon the occurrence of a fault current in the monitored electrical conductor. The fault circuitry positions a flag indicator within the module to visibly acknowledge the occurrence of the fault current in the electrical conductor. As disclosed, two air gaps prevent the inner magnetic core assembly from communicating magnetic flux from the main core assembly to the auxiliary fault sensing winding while a current sufficiently less than a fault current flows within the monitored electrical conductor.

9 Claims, 4 Drawing Sheets

FAULT INDICATOR HAVING AUXILIARY FAULT SENSING WINDING

BACKGROUND OF THE INVENTION

The present invention is generally directed to circuit monitoring devices, and more particularly, to an improved fault indicator having an auxiliary sense winding for sensing the occurrence of a fault current in a monitored electrical conductor.

Various types of fault indicators have been constructed for detecting electrical faults in power distribution systems, including clamp-on type fault indicators, which mount on a cable of the system, and test-point mounted fault indicators, which mount on the test point incorporated in a system component.

Previous clamp-on type fault indicators typically derived their operating power from the magnetic field induced around the cable by normal current flow in the cable. Upon occurrence of a fault current in the cable, these fault indicators would detect the fault current, typically by closure of a reed switch in magnetic communication with the cable, and indicate the fault by conditioning a mechanical flag or other indicating device. The fault indicators would subsequently reset in the case of manually-reset fault indicators by the operator actuating a switch, or in the case of automatically reset types upon resumption of current flow in the conductor.

The prior clamp-on type fault indicators, while providing satisfactory performance in many applications, could under certain adverse circumstances of very high adjacent magnetic field be influenced by those fields falsely tripping.

The present invention overcomes this drawback of prior clamp-on type fault indicators by providing a fault indicator which clamps over a conductor in a power distribution system and which has a sense winding responsive only to a fault current in that conductor. To accomplish this, the clamp-on type fault indicator of the present invention includes an auxiliary fault sensing winding disposed within its magnetic pole assembly. This configuration magnetically isolates the trip circuitry of the fault indicator from external magnetic fields in nearby electrical conductors.

In operation, the auxiliary winding senses a fault current in the monitored cable and delivers power to the trip circuitry of the fault indicator. The trip circuitry conditions a mechanical flag or other indicating device so that the fault status condition of the fault indicator can be observed by a lineman. A reset winding, magnetically and electrically isolated from the sense winding, supplies power to the trip and reset circuits of the fault indicator.

Accordingly, it is a general object of the present invention to provide a new and improved fault indicator.

It is a more specific object of the present invention to provide a fault indicator with trip circuitry which is magnetically isolated from an external magnetic field.

It is a still more specific object of the present invention to provide a fault indicator which indicates the occurrence of a fault current only in response to a fault current in the monitored electrical conductor.

SUMMARY OF THE INVENTION

The invention is directed to a fault indicator for indicating the occurrence of a fault current in a monitored electrical conductor, which fault indicator includes a housing and status indicating means within the housing for indication of both a fault state and a reset state of the fault indicator. A magnetic pole assembly connects the housing to the monitored electrical conductor. A reset winding disposed on the magnetic core provides operating power for the fault indicator during normal current flow in the monitored conductor. An auxiliary fault sensing winding disposed within the core sensing only fault currents in the conductor. The auxiliary fault sensing winding, which actuates a trip circuit within the fault indicator, is in magnetic communication with the magnetic core through narrow magnetic gaps. The trip circuit positions an indicator flag of the status indicating means from a normal or reset indicating state to a fault indicating state. A reset circuit periodically positions the indicator flag to the reset indicating state upon restoration of normal current in the conductor.

BRIEF DESCRIPTION OF THE DRAWINGS

The features of the present invention which are believed to be novel are set forth with particularity in the appended claims. The invention, together with the further objects and advantages thereof, may best be understood by reference to the following description taken in conjunction with the accompanying drawings, in the several figures of which like reference numerals identify like elements, and in which:

DESCRIPTION OF THE PREFERRED EMBODIMENT

Figure 1:
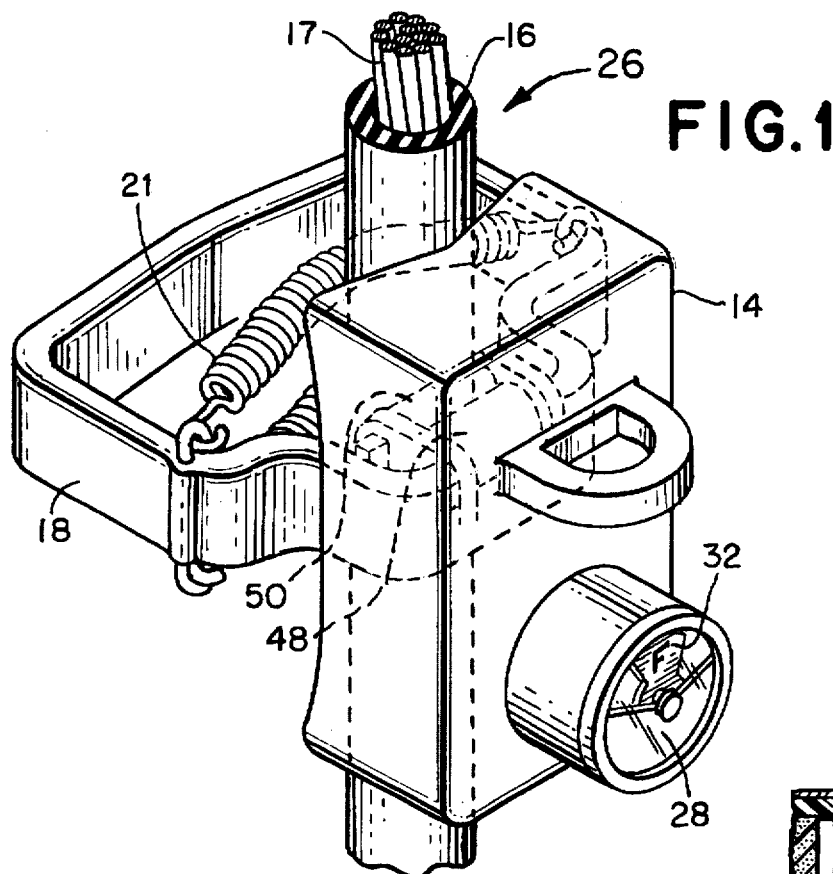
FIG. 1 is a perspective view of a clamp-on fault indicator constructed in accordance with the invention installed on a cable within a power distribution system.

Referring to the drawings, and particularly to FIGS. 1–5, a cable mounted fault indicator 12 constructed in accordance with the invention may include a generally rectangular housing 14 secured to a monitored cable 16 having a central electrical conductor 17 by means of a resilient magnetic pole assembly 18 which encircles the cable and which includes an outer main magnetic winding assembly 19 and an inner magnetic sense winding assembly 20. Magnetic pole assembly 18 is held in an enclosed position by a spring 21 which secures the monitored cable against a V-shaped recess in the housing. Within housing 14 fault indicator 12 includes a circuit board 22 (FIG. 3) on which the principal components of the indicator are mounted. A layer of potting compound 24 seals the circuit board within the housing. A circuit status is indicated by an electro-mechanically actuated indicator flag assembly 26 (FIG. 5), which is in electrical communication with the principal components of circuit board 22.

Figure 5:
FIG. 5 is an enlarged cross-sectional view showing the installed fault indicator module shown in FIGS. 1–4.
Figure 2:
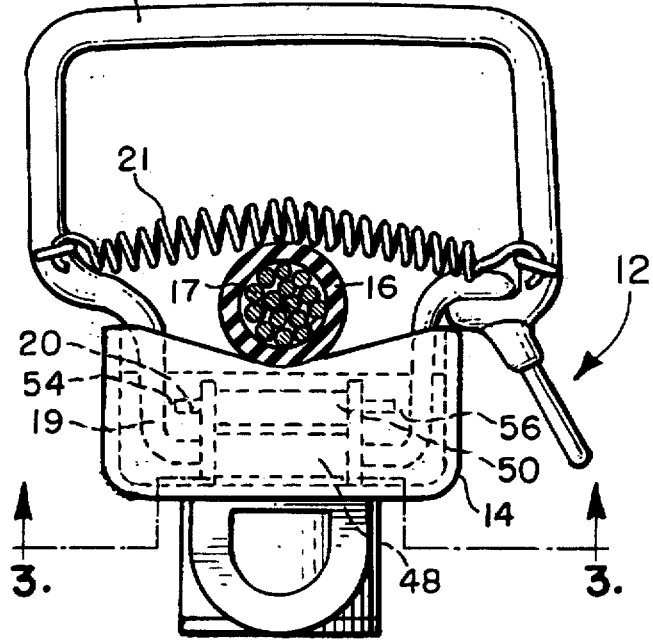
FIG. 2 is a top plan view of the fault indicator of FIG. 1 showing the engagement between the fault indicator and the cable.
Figure 3:
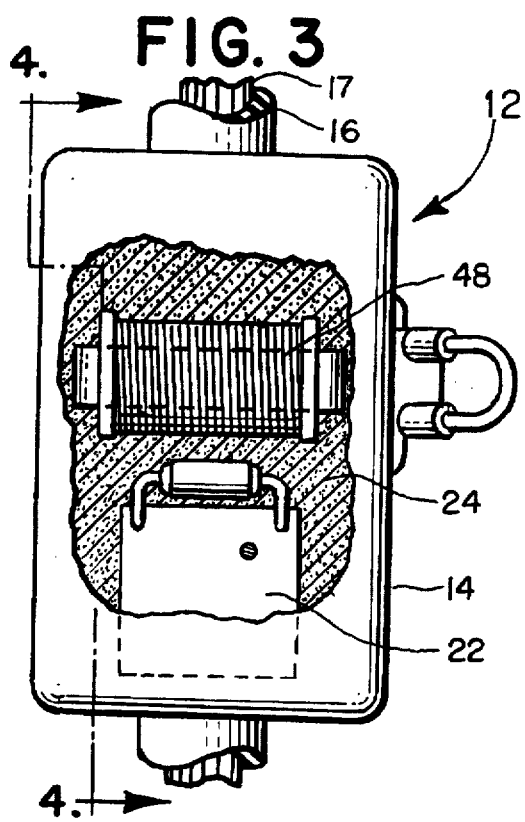
FIG. 3 is a cross-sectional view of the fault indicator of FIGS. 1 and 2 taken along line 3—3 of FIG. 2.
Figure 4:
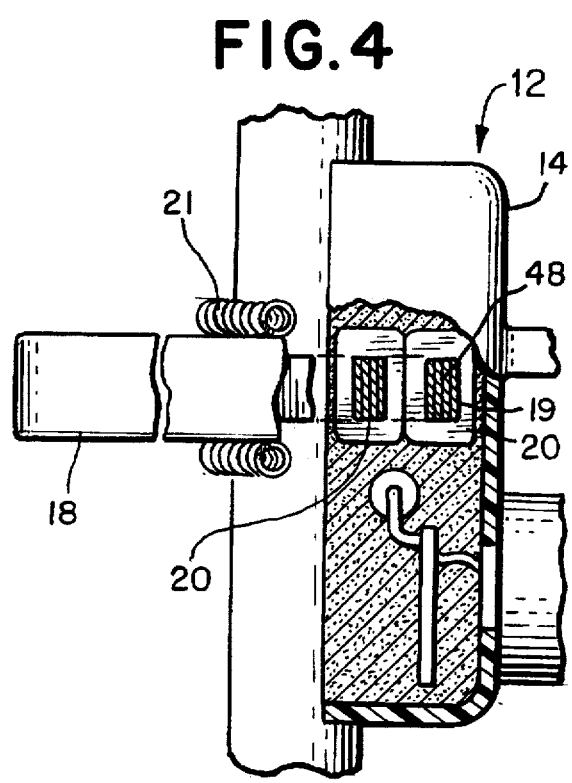
FIG. 4 is a cross-sectional view of the fault indicator of FIGS. 1, 2 and 3 taken along line 4—4 of FIG.
Figure 7A:
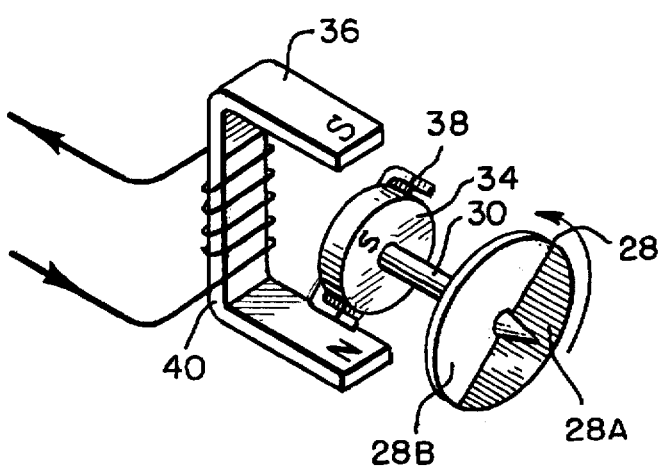
FIGS. 7A and 7B are diagrammatic views similar to FIGS. 6A and 6B, respectively, showing the principal components of the indicator flag assembly in transition between a reset indicating position and a fault indicating position.
Figure 7B:
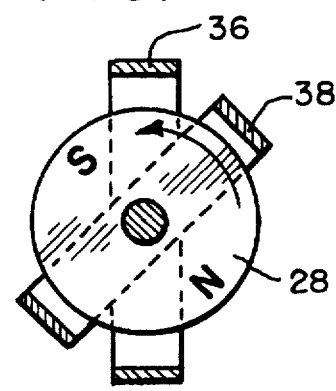
Figure 8A:
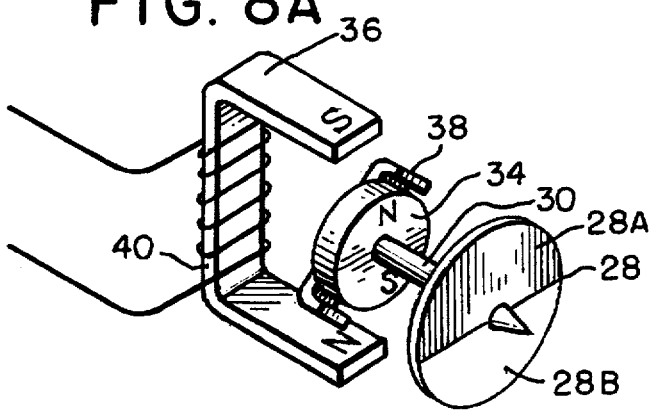
FIGS. 8A and 8B are diagrammatic views similar to FIGS. 6A and 6B, respectively, showing the principal components of the indicator flag assembly in a fault indicating position.
Figure 8B:
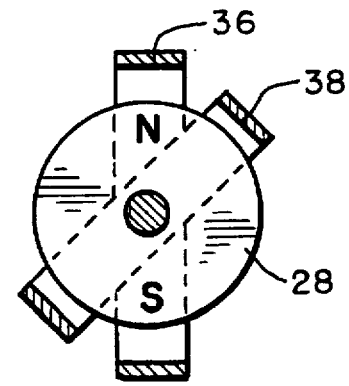

To provide an indication of the occurrence of a fault current in conductor 16, the fault indicator includes a disc-shaped target member 28 which is mounted for rotation on a pivot shaft 30. Referring to FIGS. 6–8, the face of the target member has a red segment 28A and a white segment 28B, each comprising one half of the target member face, and only one of which is visible at a time through a window 32 of housing 14 (FIGS. 1 and 5). In particular, red segment 28A is visible through window 32 when target member 28 is in a fault indicating position. Conversely, white segment 28B is visible through window 32 when target member 28 is in a reset indicating position.

Secured to and pivotal with target member 28 is a disc-shaped target actuator magnet 34 which is formed of a magnetic material having a high coercive force, such as ceramic, and which is magnetically polarized to form two magnetic poles of opposite magnetic polarity, as indicated in FIGS. 6–8. Target actuator magnet 34, and hence target member 28, are rotated between reset indicating and fault indicating positions by rotational forces exerted on the magnet by means of a stationary generally U-shaped magnetic pole piece 36, which is located within housing 14 with projecting poles thereof diametrically opposed and adjacent the edge of the magnet.

Figure 6A:
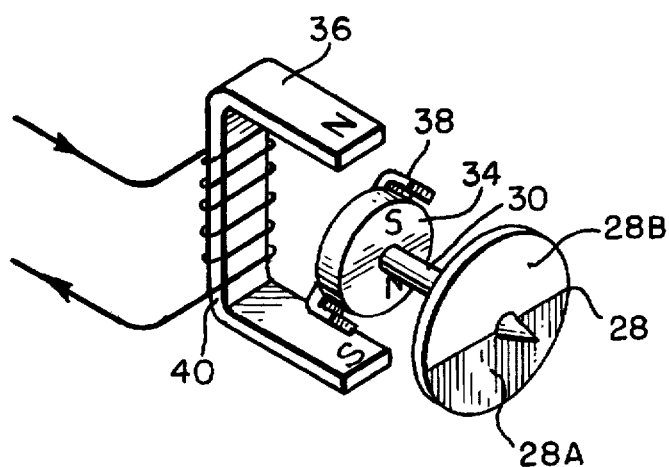
FIGS. 6A and 6B are diagrammatic views of the principal components of the indicator flag assembly of the fault indicator module in a reset indicating position.
Figure 6B:
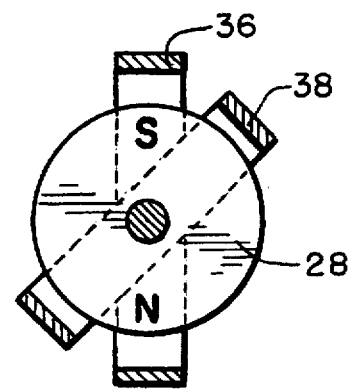

When the fault indicator is in a reset state, magnetic pole piece 36, which is preferably formed of a magnetic material having relatively low coercive force, such as a chrome steel, is magnetized at its projecting poles to the magnetic polarities indicated in FIGS. 6A and 6B. As a result, the opposite polarity magnetic poles of target actuator magnet 34 are attracted to position target member 28 in the reset indicating position as shown. In this position, the red segment 28A of the target member is not visible through window 32, and only white segment 28B is visible to indicate to an observer that the fault indicator is in a reset state.

Upon the occurrence of a fault current in monitored cable 16, which current may, for example, exceed 400 amperes, magnetic pole piece 36, and an adjacent auxiliary pole piece 38 of similar construction, are remagnetized to the magnetic polarities shown in FIGS. 7A–7B and FIGS. 8A–8B by momentary energization of a trip winding 40 on the center section of pole piece 36. As a result, the poles of target actuator magnet 34 are repelled by the adjacent like magnetic polarity poles of the pole piece and the target member is caused to rotate 180° counterclockwise to the fault indicating position shown in FIGS. 8A and 8B. In this position, the red segment 28B of the target member is visible through window 32 and a lineman viewing the fault indicator is advised that a fault current has occurred in monitored cable 16.

Target member 28 remains in the fault indicating position until the poles of magnetic pole piece 36 and auxiliary pole piece 38 are subsequently remagnetized to the magnetic polarities shown in FIGS. 6A–6B by momentary energization of trip winding 40 with a current in the opposite direction. As a result, target actuator magnet 34, and hence target member 28, are caused to rotate from the fault indicating position shown in FIGS. 8A–8B to the reset indicating position shown to FIGS. 6A–6B, and the fault indicator is conditioned to respond to a subsequent fault current in monitored cable 16.

Energization of actuator winding 40 in one direction upon occurrence of a fault current in monitored cable 16, and energization of winding 40 in the other direction upon restoration of current in the monitored cable following a fault current, is accomplished by means of externally powered trip and reset circuitry in the fault indicator. Referring back to FIGS. 1–4, magnetic pole assembly 18 includes an outer main magnetic core assembly 19 and an inner sensing magnetic core assembly 20. The magnetic core effectively magnetically isolates the fault sensing circuitry of fault indicator 12 from a magnetic field external to the indicator, thereby preventing the indicator from being responsive to the magnetic field resulting from currents in a nearby electrical conductor (not shown).

Figure 9:
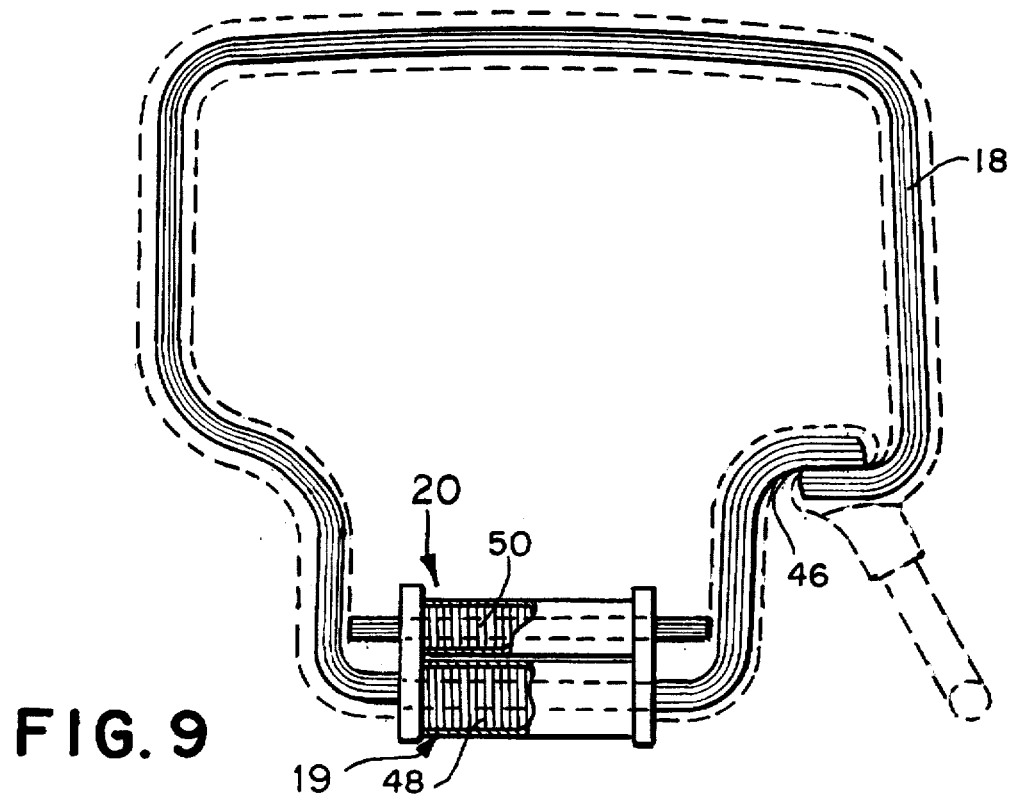
FIG. 9 is an enlarged cross-sectional view of the magnetic core assembly of the fault indicator.

Referring to FIG. 9, the magnetic core 18 includes an air gap 46 which allows the core to be installed over a power system cable. This core enables the reset circuitry and the trip circuitry found on circuit board 22 to derive operating power only from current flow in the monitored conductor 17.

The trip circuitry on circuit board 22 is powered by an auxiliary fault sensing winding 50, independent of reset power winding 48, which is wrapped around inner magnetic core 20. Inner magnetic core 20 is disposed within the perimeter of core assembly 18 and is positioned to form two air gaps 54 and 56 on the two ends of the inner magnetic core which are adjacent to the outer magnetic core. Air gaps 54 and 56 are set to predetermined sizes which will prevent the energization of auxiliary fault sensing winding 50 when only a normal operating current flows in monitored cable 16 but will, at the same time, permit the energization of the auxiliary fault sensing winding when a fault current flows in the cable. Those skilled in the art will appreciate that air gaps 54 and 56 are each sized to comprise a sufficiently high enough reluctance which prevents their transmission of the magnetic flux resulting from a normal operating current in the cable. In particular, the sizes of air gaps 54 and 56 are sufficiently large enough to prevent the formation of a magnetic circuit path comprising outer magnetic core 19, air gap 54, inner magnetic core 20, and air gap 56 when only a normal operating current flows in monitored cable 16. At the same time, those skilled in the art will appreciate that air gaps 54 and 56 are each sized to comprise a sufficiently low enough reluctance which permits their transmission of the magnetic flux resulting from a fault current in monitored cable 16. In particular, the sizes of air gaps 54 and 56 are sufficiently small enough to permit the formation of a magnetic circuit comprising the above described path when a fault current flows in monitored cable 16. In other words, the magnetic flux resulting from a fault current in monitored cable 16 saturates outer magnetic core 19 to the point where a substantial portion of that flux flows through the magnetic circuit path comprising outer magnetic core 19, air gap 54, inner magnetic core 20 and air gap 56. When a fault current flows in monitored cable 16, the resulting magnetic flux in the described path energizes auxiliary fault sensing winding 50, which thereafter powers the trip circuitry located within housing 14 of the fault indicator.

Figure 10:
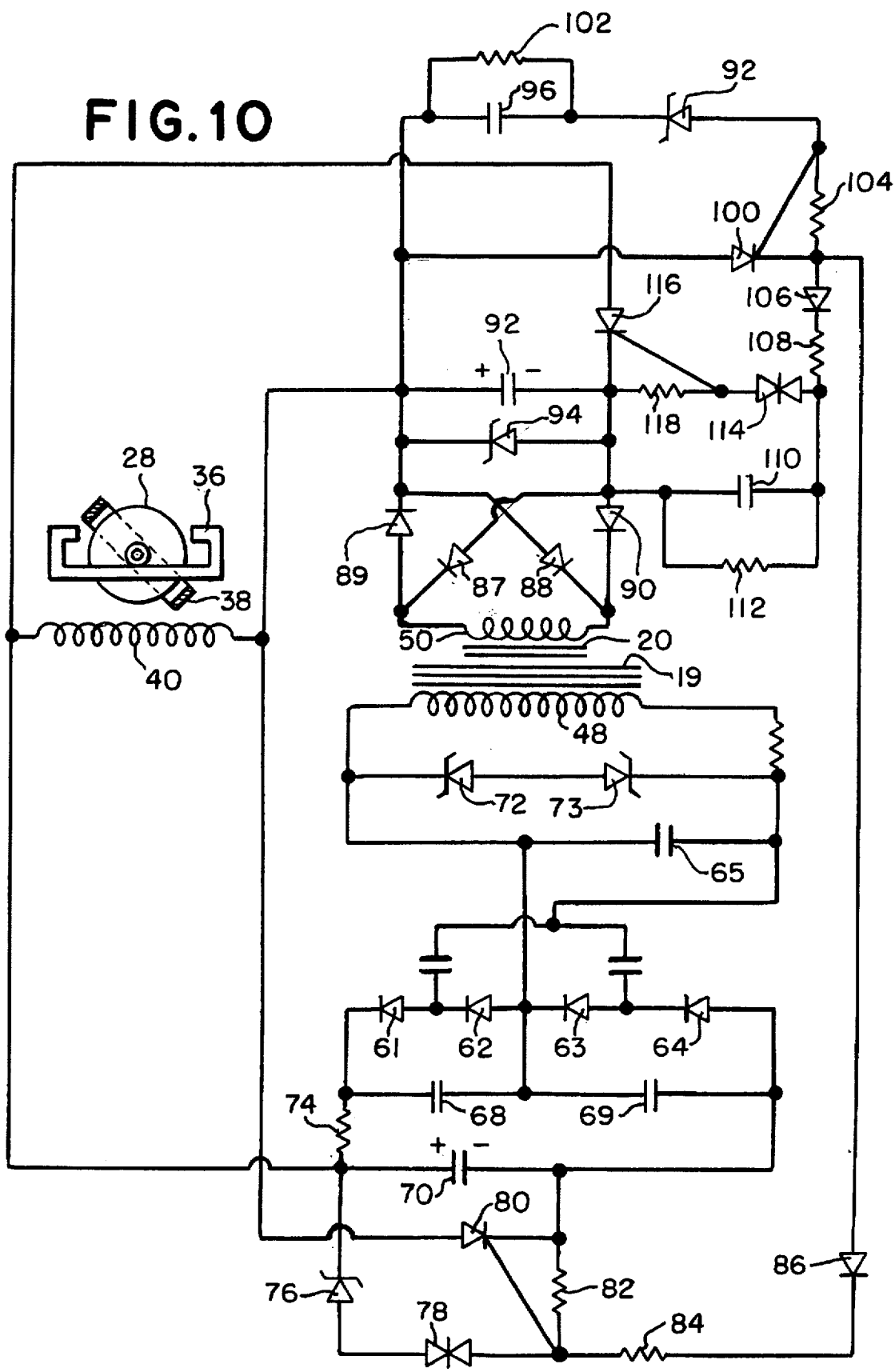
FIG. 10 is an electrical schematic diagram of the circuitry of the fault indicator module shown in FIGS. 1–5.

Referring now to the schematic diagram shown in FIG. 10, operating power for the energization of trip winding 40 and consequent actuation of target member 28 is accomplished by means of reset circuitry and trip circuitry within the fault indicator module. In particular, upon normal current flow in monitored conductor 17, a magnetic flux flows through outer magnetic core assembly 19 which energizes the main reset power winding 48, producing an alternating voltage across the terminals of the winding. A voltage quadrupler comprising diodes 61–64 and capacitors 65–69 is connected to reset power winding 48 so that an increased resulting voltage is developed across a reset capacitor 70 when a normal line current flows within the monitored cable. It will be appreciated that the voltage quadrupler depicted in FIG. 9 operates in a manner well known in the art. Two opposing zener diodes 72 and 73, each preferably having a relatively high breakdown voltage, serve to limit the maximum voltage developed across the voltage quadrupler while current flows within monitored conductor 17.

Reset capacitor 70 continues to develop an increasing voltage across its terminals until the level of that voltage exceeds the respective breakdown and threshold voltage levels of a zener diode 76 and a four layer bilateral diode 78, respectively. Once these respective voltage levels are exceeded, the reset capacitor discharges a pulse of current to the gate control electrode of a silicon controlled rectifier (SCR) 80, rendering that device conductive. A resistor 82 is connected between the cathode and gate electrodes of SCR 80 as a drain impedance for the SCR.

After SCR 80 is rendered conductive, reset capacitor discharges the majority of its charge through actuator winding 40 which, in turn, positions target member 28 to its reset indicating position. A resistor 84 and a reverse-biased diode 86 isolate the components within the reset circuitry from the components within the trip circuitry. Furthermore, as will be later described, these two components help prevent simultaneous actuation of target member 28 to both its fault indicating position and its reset indicating position.

Once the voltage across reset capacitor 70 drops to a sufficiently low level during the discharge phase of that capacitor, SCR 80 shuts off and the reset capacitor will once again begin to store charge and develop a voltage across its terminals, assuming that a current still flows within monitored cable 16. Since the charge phase and discharge phase of reset capacitor 70 occurs periodically, target member 28 is periodically positioned to its reset indicating position throughout the time period when current flows within the monitored conductor.

Upon the occurrence of a fault current within conductor 17, the magnetic flux within outer magnetic core assembly 19 begins to saturate and a substantial amount of magnetic flux flows through air gap 54, inner magnetic core 20 and air gap 56. In turn, auxiliary fault sensing winding 50, which is in magnetic communication with inner magnetic core assembly 19 is energized. This produces an alternating current which is rectified by a bride rectifier network comprising diodes 87–90 to produce a unidirectional pulsating current across its terminals.

This rectified current stores charge across the terminals of a trip capacitor 92 having a relatively low capacitance. A reverse-biased zener diode 94 limits the maximum voltage across trip capacitor 92 in a manner well known in the art.

Upon completion of the charging phase of trip capacitor 92, that capacitor discharges a pulse of current through a trip pass capacitor 96 having a relatively high capacitance. This pulse of current is then transmitted though reverse-biased zener diode 98, which serves as a threshold device for the actuation of target member 28 to its fault indicating state. The pulse of current is applied to the gate control electrode of a silicon controlled rectifier (SCR) 100 to render that device conductive. Resistor 102 is connected across the terminals of trip pass capacitor 96 to bleed off any charge developed across the trip pass capacitor while the pulse of current was transmitted to the gate electrode of SCR 100. Resistor 104 is connected between the gate control and cathode electrodes of SCR 100 as a drain impedance for the SCR.

Once SCR 100 is rendered conductive, trip capacitor 92 discharges current through that device. A majority of this current flows through forward-biased diode 106 and resistor 108 to several of the other components within the trip circuitry. However, a portion of this current flows through resistor 84 and diode 86 to the gate electrode of SCR 80, rendering that device conductive. Once SCR 80 is conductive, reset capacitor discharges through trip winding 40, thereby actuating target member 28 to its reset indicating state prior to the actuation of that target member to its fault indicating state by the trip circuitry. As mentioned above, this prevents the simultaneous actuation of target member 28 to its trip and reset indicating states. More specifically, this configuration ensures that reset capacitor 70 is discharged just prior to the actuation of target member 28 to its fault indicating state. Accordingly, target member 28 is permitted to remain in its fault indicating state for a full reset period.

The majority of current which is discharged by trip capacitor 92 through forward-biased diode 106 and resistor 108 is stored across a capacitor 110. Acting with capacitor 110 to develop a time delay is a high impedance resistor 112 which is connected across the terminals of the capacitor. This time delay permits the above-described actuation of target member 28 to its reset indicating state prior to the actuation of the target member to its fault indicating state. This, in turn, permits reset capacitor 70 to become fully discharged prior to the actuation of target member 28 to its fault indicating state, thereby ensuring that a fault status condition remains for a full reset period.

Once the voltage developed across capacitor 110 exceeds the threshold voltage of a four layer bilateral diode 114, that capacitor discharges a pulse of current through the four layer bilateral diode to the gate control electrode of a silicon controlled rectifier (SCR) 116, rendering that device conductive. Diode 106 isolates capacitor 110 from SCR 100. Resistor 112 bleeds off any additional charge across capacitor 110 after that capacitor discharges the pulse of current to the gate control electrode of SCR 116. A resistor 118 is connected between the cathode and the gate control electrodes of SCR 116 as a drain impedance for the SCR.

Upon SCR 116 becoming conductive, trip capacitor 92 discharges the majority of its remaining charge through trip winding 40 which, in turn, actuates target member 28 to its fault indicating position. Upon the discharge of trip capacitor 92 to a voltage of sufficiently low level, SCR 116 ceases to conduct and target member 28 remains in its fault indicating position until it is subsequently actuated by the reset circuitry back to its reset indicating position.

While a particular embodiment of the invention has been shown and described, it will be obvious to those skilled in the art that changes and modifications may be made therein without departing from the invention in its broader aspects, and, therefore, the aim in the appended claims is to cover all such changes and modifications as fall within the true spirit and scope of the invention.

I claim:

1. A fault indicator for indicating an occurrence of a fault current in an electrical conductor of a monitored cable comprising:

a housing;

status indicating means within said housing, said status indicating means having a reset indicating state and a fault indicating state;

a magnetic pole assembly mounting said housing to said monitored cable;

a first magnetic core within said magnetic pole assembly, said first magnetic core being responsive to a current in said electrical conductor;

a second magnetic core within said magnetic pole assembly, said second magnetic core being responsive to said occurrence of said fault current in said electrical conductor;

reset circuit means for conditioning said status indicating means to said reset indicating state, said reset circuit means including a reset power winding wound on said first magnetic core, said reset power winding being energized by said current in said electrical conductor; and trip circuit means for conditioning said status indicating means to said fault indicating state in response to said occurrence of said fault current in said electrical conductor, said trip circuit means including an auxiliary fault sensing winding independent of said reset power winding and wound on said second magnetic core, said auxiliary fault sensing winding and said second magnetic core being disposed within a perimeter of said first magnetic core, said auxiliary fault sensing winding being energized by said fault current in said electrical conductor.

2. A fault indicator as defined in claim 1, wherein said second magnetic core includes second isolating means for magnetically isolating said second magnetic core from a normal current flow in said electrical conductor.

3. A fault indicator as defined in claim 2, wherein said second isolating means comprises at least one air gap.

4. A fault indicator as defined in claim 3, wherein said second isolating means comprises an additional air gap.

5. A fault indicator as defined in claim 4, wherein said at least one air gap is intermediate a first end of said second magnetic core and an inside surface of said first magnetic core.

6. A fault indicator as defined in claim 5, wherein said additional air gap is intermediate of a second end of said second magnetic core and an inside surface of said first magnetic core.

7. A fault indicator as defined in claim 3, wherein said at least one air gap is of a predetermined size.

8. A fault indicator as defined in claim 4, wherein said additional air gap is of a predetermined size.

9. A fault indicator for indicating an occurrence of a fault current in an electrical conductor of a monitored cable comprising:

a housing;

status indicating means within said housing, said status indicating means having a reset indicating state and a fault indicating state;

a magnetic pole assembly connecting said housing to said monitored cable;

a first magnetic core within said magnetic pole assembly, said first magnetic core being responsive to a current in said electrical conductor;

a second magnetic core within said magnetic pole assembly, said second magnetic core being responsive to said occurrence of said fault current in said electrical conductor;

a first end of said second magnetic core being adjacent to an inside surface of said first magnetic core and forming a first air gap intermediate said first end and said inside surface of said first magnetic core;

a second end of said second magnetic core being adjacent to said inside surface of said first magnetic core and forming an additional air gap intermediate said first end;

reset circuit means for conditioning said status indicating means to said reset indicating state, said reset circuit means including a reset power winding, said reset power winding being wound on said reset power winding, said reset power winding further being energized by said current in said electrical conductor; and trip circuit means for conditioning said status indicating means to said fault indicating state in response to said occurrence of said fault current in said electrical conductor, said trip circuit means including an auxiliary fault sensing winding independent of said reset power winding, said auxiliary fault sensing winding being disposed within a perimeter of said first magnetic core, said auxiliary fault sensing winding being further wound on said second magnetic core, said auxiliary fault sensing winding further being energized by said fault current in said electrical conductor.

* * * * *